(12) United States Patent
Ohiaeri et al.

(10) Patent No.: US 9,087,355 B2
(45) Date of Patent: *Jul. 21, 2015

(54) PRODUCT CUSTOMIZATION SYSTEM AND METHOD

(75) Inventors: Charles Ohiaeri, San Francisco, CA (US); Leslie Young Harvill, Half Moon Bay, CA (US); Robert Irven Beaver, III, San Francisco, CA (US)

(73) Assignee: ZAZZLE INC., Redwood City, CA (US)

( * ) Notice: Subject to any disclaimer, the term of this patent is extended or adjusted under 35 U.S.C. 154(b) by 538 days.

This patent is subject to a terminal disclaimer.

(21) Appl. No.: 13/342,103

(22) Filed: Jan. 1, 2012

(65) Prior Publication Data

US 2012/0197422 A1    Aug. 2, 2012

Related U.S. Application Data (63) Continuation-in-part of application No. 12/546,582, filed on Aug. 24, 2009, now Pat. No. 8,090,461.

(60) Provisional application No. 61/091,316, filed on Aug. 22, 2008.

(51) Int. Cl.
  *G06F 19/00* (2011.01)
  *B41J 2/00* (2006.01)
  *G06Q 30/00* (2012.01)
  *G06Q 30/06* (2012.01)

(52) U.S. Cl.
  CPC ................... *G06Q 30/0603* (2013.01)

(58) Field of Classification Search
  CPC ................................................ G06Q 30/0621
  USPC .............................................................. 700/98
  See application file for complete search history.

(56) References Cited

U.S. PATENT DOCUMENTS

| | | | |
|---|---|---|---|
| 5,134,669 A * | 7/1992 | Keogh et al. ................. | 382/318 |
| 5,850,222 A | 12/1998 | Cone | |
| 6,173,211 B1 | 1/2001 | Williams et al. | |
| 6,196,146 B1 | 3/2001 | Goldberg et al. | |
| 6,280,891 B2 | 8/2001 | Daniel | |
| 6,310,627 B1 | 10/2001 | Sakaguchi | |
| 6,473,671 B1 | 10/2002 | Yan | |
| 6,513,921 B1 | 2/2003 | Houle | |
| 6,546,309 B1 | 4/2003 | Gazzuolo | |

(Continued)

FOREIGN PATENT DOCUMENTS

| | | |
|---|---|---|
| EP | 1136899 | 9/2001 |
| JP | 10-222653 A | 8/1998 |

(Continued)

OTHER PUBLICATIONS

PCT/US08/81215 International Search Report dated Jan. 5, 2009, 2 pages.

(Continued)

*Primary Examiner* — Mohammad Ali
*Assistant Examiner* — Yuhui R Pan
(74) *Attorney, Agent, or Firm* — DLA Piper LLP (US)

(57) ABSTRACT

A product customization system and method are provided in which a consumer can insert user content, such as images or text, onto a product, such as a skateboard, and then view the customized product before purchasing the customized product.

12 Claims, 11 Drawing Sheets

(56) References Cited

U.S. PATENT DOCUMENTS

| | | | |
|---|---|---|---|
| 6,564,118 | B1 | 5/2003 | Swab |
| 6,804,573 | B2 | 10/2004 | Goldman |
| 6,842,532 | B2 | 1/2005 | Hu et al. |
| 6,907,310 | B2 | 6/2005 | Gardner et al. |
| 6,947,808 | B2 | 9/2005 | Goldman |
| 6,968,075 | B1 | 11/2005 | Chang |
| 6,994,201 | B2 * | 2/2006 | Yu et al. .................. 194/207 |
| 7,016,756 | B2 | 3/2006 | Goldman |
| 7,016,757 | B2 | 3/2006 | Goldman |
| 7,216,092 | B1 | 5/2007 | Weber et al. |
| 7,409,259 | B2 | 8/2008 | Reyes Moreno |
| 7,479,956 | B2 | 1/2009 | Shaw-Weeks |
| 2001/0026272 | A1 | 10/2001 | Feid et al. |
| 2002/0099524 | A1 | 7/2002 | Sell et al. |
| 2003/0076318 | A1 | 4/2003 | Shaw-Weeks |
| 2003/0120183 | A1 | 6/2003 | Simmons |
| 2003/0168148 | A1 | 9/2003 | Gerber et al. |
| 2003/0179197 | A1 * | 9/2003 | Sloan et al. .................. 345/426 |
| 2003/0182402 | A1 | 9/2003 | Goodman et al. |
| 2003/0184544 | A1 | 10/2003 | Prudent |
| 2004/0078285 | A1 | 4/2004 | Buvoet |
| 2004/0194344 | A1 | 10/2004 | Tadin |
| 2004/0227752 | A1 * | 11/2004 | McCartha et al. ............ 345/419 |
| 2004/0236634 | A1 | 11/2004 | Ruuttu |
| 2005/0131571 | A1 | 6/2005 | Costin |
| 2005/0155316 | A1 * | 7/2005 | Shipley .................. 52/741.1 |
| 2005/0177453 | A1 | 8/2005 | Anton et al. |
| 2005/0238251 | A1 | 10/2005 | Lunetta et al. |
| 2006/0015207 | A1 | 1/2006 | Weiser et al. |
| 2006/0020486 | A1 | 1/2006 | Kurzweil et al. |
| 2006/0226563 | A1 * | 10/2006 | Albert et al. ................. 264/1.34 |
| 2007/0083383 | A1 * | 4/2007 | Van Bael et al. .................. 705/1 |
| 2007/0208633 | A1 | 9/2007 | Singh |
| 2008/0079727 | A1 | 4/2008 | Goldman et al. |
| 2008/0147512 | A1 * | 6/2008 | Yankton .................. 705/26 |
| 2009/0070666 | A1 | 3/2009 | Eilers et al. |
| 2009/0122329 | A1 | 5/2009 | Hegemier et al. |
| 2009/0190858 | A1 | 7/2009 | Moody et al. |
| 2009/0254207 | A1 * | 10/2009 | Tiffany et al. .................. 700/97 |
| 2010/0169185 | A1 | 7/2010 | Cottingham |
| 2010/0185309 | A1 | 7/2010 | Ohiaeri et al. |

FOREIGN PATENT DOCUMENTS

| | | |
|---|---|---|
| JP | 10-247256 A | 9/1998 |
| JP | 11-066119 A | 3/1999 |
| JP | 2003-122960 A | 4/2003 |
| JP | 2004-152000 A | 5/2004 |
| WO | WO 01/87001 A2 | 11/2001 |
| WO | WO 2008/038039 A2 | 4/2008 |

OTHER PUBLICATIONS

PCT/US08/81215 Written Opinion dated Jan. 5, 2009, 6 pages.
PCT/US09/61858 International Search Report dated Dec. 18, 2009, 4 pages.
PCT/US09/61858 Written Opinion dated Dec. 18, 2009, 5 pages.
PCT/US09/52154 International Search Report dated Sep. 23, 2009, 3 pages.
PCT/US09/52154 Written Opinion dated Sep. 23, 2009, 6 pages.
EP Application No. 08843251.3 Supplemental Search Report dated Nov. 23, 2010, 11 pages.
EP Application No. 09822776.2 Supplemental Search Report dated Mar. 2, 2012, 9 pages.
Demarco "Zazzle and Pitney Bowes Team up to deliver custom stamps to consumers," (2005), published online: http//www.zazzle.com/mk/welcome/pressreleases/pr071805_2 (2 pages).
Ehara J et al: "Texture overlay onto deformable surface for virtual clothing" ACM International Conference Proceeding Series—Proceedings of the 2005 International Conference on Augmented Tele-Existence, ICAT '05 2005 Association for Computing Machinery USA, vol. 157, 2005 , pp. 172-179, XP002606672 Do!: DOI:10.1145/1152399.1152431 (8 pages).
Ehara J et al: "Texture overlay for virtual clothing based on PCA of silhouettes" Mixed and Augmented Reality, 2006. ISMAR 2006. IEEE/ACM International Symposium on, IEEE, PI, Oct. 1, 2006, pp. 139-142, XP031014661 ISBN: 978-1-4244-0650-0 (4 pages).
Meseth "Towards Predictive Rendering in Virtual Reality" Ph.D. dissertation, Bonn University, published Oct. 2006 (369 pages).
Nelson, J "From Moon Shoes to Gel Gun—Sustaining Hart health", Columbian. Vancouver, Wash.: Oct. 11, 2007 (3 pages).
Scholz V et al: "Garment motion capture using color-coded patterns" Computer Graphics Forum Blackwell Publishers for Eurographics Assoc UK, vol. 24, No. 3, 2005 , pp. 439-439, XP002603022 ISSN: 0167-7055 (9 pages).
PCT/US09/54806 International Search Report dated Oct. 7, 2009.
PCT/US09/54806 Written Opinion dated Oct. 7, 2009.
First Chinese Office Action of CN 200980142106.8 in English and Chinese; dated May 4, 2012; (12 pgs.).
Korean Notice of Final Rejection of KR 2011-7006631 in English and Korean; dated Oct. 30, 2012; (7 pgs.).
Australian Patent Examination Report No. 1 of AU 2009308274; dated Nov. 2, 2012; (4 pgs.).
Japanese Notification of Reason(s) for Rejection of JP 2011-524069 in English and Japanese; dated Nov. 29, 2012; (6 pgs.).
Korean Notice of Final Rejection of KR 2011-7006631 in English and Korean; dated Dec. 21, 2012; (9 pgs.).
Chinese Decision on Rejection of CN 200980142105.8 in English and Chinese; dated Mar. 4, 2013; (13 pgs.).
PCT International Search Report of PCT/US12/71865; dated Mar. 8, 2013; (2 pgs.).
PCT Written Opinion of the International Searching Authority of PCT/US12/71865; dated Mar. 8, 2013; (4 pgs.).
PCT International Preliminary Report on Patentability of PCT/US12/71865; dated Jul. 1, 2014; (1 pg.).
European Communication pursuant to Article 94(3) EPC of EP 09808921.2; dated May 31, 2013; (4 pgs.).
Canadian Office Action of CA 2,737,908; dated Jun. 4, 2013; (2 pgs.).
Japanese Decision of Final Rejection of JP 2011-524069 in English and Japanese; dated Jul. 31, 2013; (6 pgs.).

* cited by examiner

PRODUCT CUSTOMIZATION SYSTEM AND METHOD

PRIORITY CLAIMS/RELATED APPLICATIONS

This application claims priority to under 35 USC 120 and is a continuation in part of U.S. patent application Ser. No. 12/546,582, filed on Aug. 24, 2009 and entitled "Product Customization System and Method," which application in turn claims priority under 35 USC 119(e) and 120 to U.S. Provisional Patent Application Ser. No. 61/091,316, filed on Aug. 22, 2008 and entitled "Product Customization System and Method", all of which are incorporated herein by reference.

FIELD

The system relates to a product customizing system and method.

BACKGROUND

Markings for the purpose of information, ornamentation, expression, and fashion are applied to products with a variety of means. Until recently relatively few designs of product have been produced in large volumes. Just In Time (JIT) Manufacturing processes have enabled the production of many designs in production runs from 1 to 100 using custom marking of product surfaces with techniques such as inkjet printing and other digital print methods. There are also a class of technologies which may produce volumetric forms (3d objects) through the use of Stereo Lithography, Fused Deposition Modeling, and other processes. Currently there is not a unified method for the commercial design and manufacturing of layered optically-active surfaces for products with a complex curved form. There are systems for managing and applying a specialized subset of films (Cyan, Magenta and Yellow process color films) and for manufacturing custom lenses and gratings for the optics industry, but not for the interactive application of component based optical surfaces on commercial products. Thus, it is desirable to provide a customized product system and method that allows a consumer to provide user content that is then applied to the product and it is to this end that the system and method are directed.

DETAILED DESCRIPTION OF ONE OR MORE EMBODIMENTS

The system and method are particularly applicable to web-based client/server architecture system for a skateboard customization system and method implemented in software on a computer as described below and it is in this context that the system and method will be described. It will be appreciated, however, that the system and method can be used to customize any product in which it would be desirable to allow a consumer/user to insert user content onto a product with an uneven surface/texture that can be manufactured by the system. For example, the system may be used to design customized skateboards (the example described below), customized globes, customized baseball bats, customized car tops, or any other product with an uneven/textured surface in which a user might want to add a customized design. In addition, the system and method can be implemented in software (shown in the illustrated implementation), hardware or a combination of hardware and software and may also be implemented on client/server system (shown in the illustrated implementation), a web server, a terminal, a peer to peer system and the like so that the system and method are not limited to the particular implementation of the system or method.

Figure 1A:
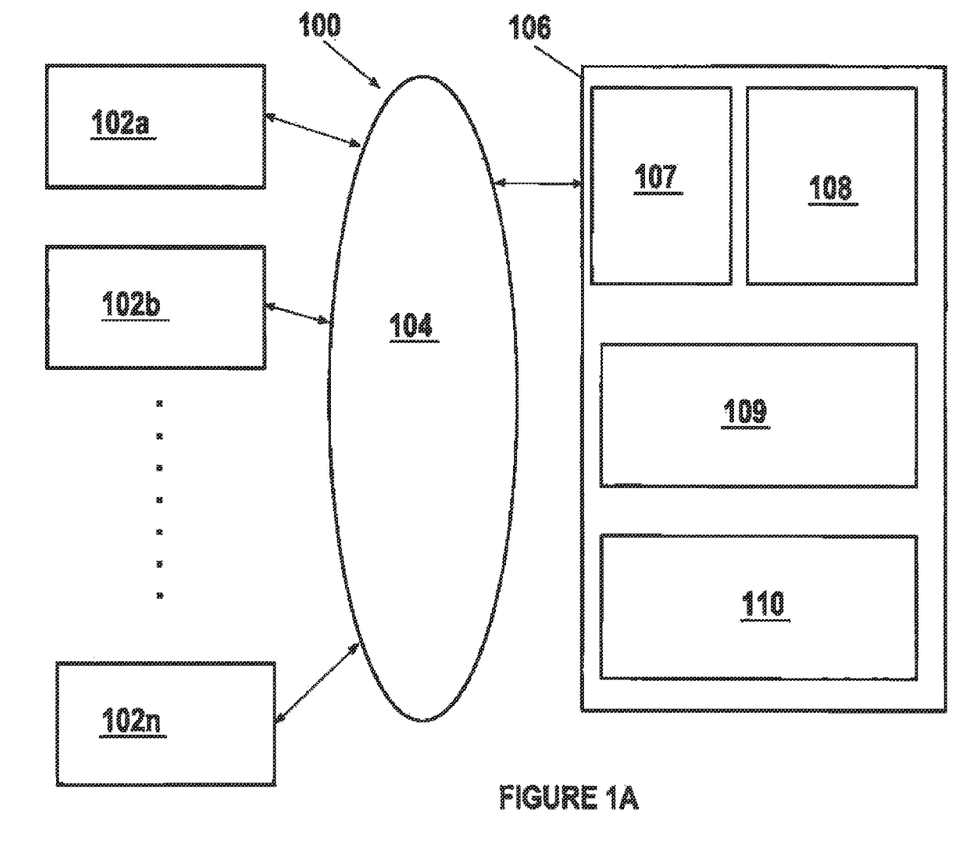
FIG. 1A illustrates an example of an embodiment of a product customization system.

FIG. 1A illustrates an example of an implementation of a product customization system 100. The system may include one or more consumer computing devices 102, such as 102a, 102b, . . . , 102n, wherein each computing device has at least one processing unit, memory, some persistent memory, some other memory, a display device and input/output devices and each may be a personal computer, mobile device, cellular device, wireless email device, converged device such as a Treo or Blackberry and the like that permit the consumer to interact with the consumer computing device as well as the system through an application, such as for example a known browser application, being executed by the consumer computing device. Each consumer computing device may establish a connection with and communicate over a link 104 using a typical secure or unsecure protocol with a product customization unit 106. The link 104 may be implemented using a computer network, a cellular network, a wired or wireless link and the like, In one embodiment, the link is the Internet. The product customization unit 106 may be implemented in hardware, software or a combination of hardware and software. In one embodiment, the product customization unit 106 may be one or more server computers that execute a plurality of lines of computer code to perform the functions and operations of the product customization unit 106 as described below.

In one illustrative embodiment, the product customization unit 106 may further comprise at least one web server 107 (implemented in hardware or software or a combination of the two) that establishes a connection with each consumer computer device, receives requests from each consumer computer device and communicates data and information (such as by using one or more web pages) and requests for consumer computer device information to each consumer computer device wherein the consumer computer device interacts with the web server using a known secure or unsecure protocol and a typical browser application. The at least one web server, for example, may serve a web page that allows the consumer to browse the available products and designs and then, using the product customization system, customize the particular design of a particular product using user content. The product customization unit may further include a store 108 that contains and stores the relevant information for the product customization unit including the product information and images for the web pages, customization data, etc. The product customization unit may further comprise a product customizer 109 (that may be implemented as a plurality of lines of computer code wherein the plurality of lines of computer code are executed by the processing unit(s) of the server computers to implement the product customization system) that allows a consumer to customize a product, allows a consumer to upload user content (images and/or text), allows the consumer to place the user content on the product, allows the consumer to view the customized product for all angles, allows the consumer to customize various features of the product, and manufacture the customized product once it has been designed as described below in more detail. The product customization unit may further comprise a well known ecommerce engine 110 that, once the consumer has customized a product with particular user content, may allow the consumer to purchase the customized product. In one implementation, the product customization system may also be part of a larger web site/system such as, for example, www.zazzle.com.

The system and method described above may be used by a user or designer to select and place surfaces with a variety of optical qualities and effects on a product which has a complex curved form. The system and method include methods for the manufacture of these products, for creating a model of the surface qualities, for displaying images of the products interactively to the user and for calibrating those images based on output of finished product.

The system allows a consumer to control apparent color and color changes over viewing angles (as shown in the user interface examples described below), the surface reflectivity (gloss) of the surface, and the apparent depth of visual elements within the product surface. The system also incorporates a manufacturing process which can apply a material in a specific location on a substrate wherein the material may be bonded to the substrate through the interaction of the material with light, heat, evaporation, electrical charge, or triggered catalytic process. For example when light is used for the bonding process, the time at which the light is applied, the intensity and the location of light affects the shape of the material deposit as it bonds to the substrate and to its neighboring material deposits and forms a film that whose characteristics change in response to the character of the light. Then, additional materials may be deposited to form layers of deposited films on the substrate with a variety of surface depths and textures. These surface characteristics can produce these properties:

1. diffuse (matte) surface.
2. smooth (gloss) surface.
3. figured (Fresnel) surface.
4. Refractive (grating) surface.
5. patterned surface.

For example, the substrate may be layered with opaque cut film that may be used to replace opaque printing as described above or the substrate may be layered with subtractive cuts to product relief surfaces for overprint such as laser etching or "sunken-relief". The substrate may also be layered with printing passes to produce relief surfaces for overprint ("bas-relief"). The substrate may also be layered to produce alto/high reliefs (See http://en.wikipedia.org/wiki/Relief which is incorporated herein by reference for a definition of the different types of reliefs).

Further, the set of materials deposited on the substrate may have a wide variety of different optical properties:

1. Transparency or Opacity
2. Refractive Index
3. Absorption Spectra
4. Reflectivity
5. Light Phase Change (quarter and half wave effects)
6. Polarization changes.

The interaction of these materials in layers may change a wavefront of light which strikes it due to a variety of optical effects within the layered film:

1. Surface Reflection
2. Internal Occlusion by layer (opaque regions separated by transparency)
3. Refraction by Refractive Index change.
4. Reflection by constructive interference (Lippmann-Bragg effect)
5. Refraction by interference (Grating effect)
6. Attenuation through polarization.
7. Attenuation of reflection through spectral absorption.
8. Attenuation of transmission through spectral absorption.
9. Diffusion (translucent regions over dark regions).

The substrate to which these materials are applied may be either a receiver sheet, or a bonding sheet.

In the receiver sheet case:

1. The receiver sheet may be optically or mechanically figured to produce the product surface texture.
2. Optically active layers are applied in the viewer to product surface direction.
3. A product bonding layer is applied last
4. The film layer is applied to the complex curved surface of the product using pressure and heat.
5. Trimming is performed.
6. The receiver is removed.

In the bonding sheet case:

1. Optically active layers are applied in the product surface to view direction.
2. The final layer may be transparent and may figured by timed attenuation of light.
3. The film layer is applied to the complex curved surface of the product using pressure and heat.
4. Trimming is performed.

At startup, a set of reference film layers are made to characterize the transport of light through layers produced by a specific manufacturing system. These reference films are used to characterize and model the light transport within chosen layer groups. These groups optimize each optical effect, such as occlusion, The method for modeling this interaction is described later as the Layered Light Transport Component. A transport function is built for each reference film unit. Surface texture libraries are built by layering models of reference-film units interactively, these may be specified at the pixel level. Finished textures are compiled into a simplified Layered Light Transport Material, and may be selected and applied by Users and Designers. The resulting design can be viewed interactively.

For purposes of illustrating the product customization system and method, a product customization method and user interface for a skateboard upon which user content is placed is described below. However, the product customization system may also be used for other products with uneven/textured surfaces in which it is desirable to provide a consumer with the ability to customize the product with user content.

Figure 1B:
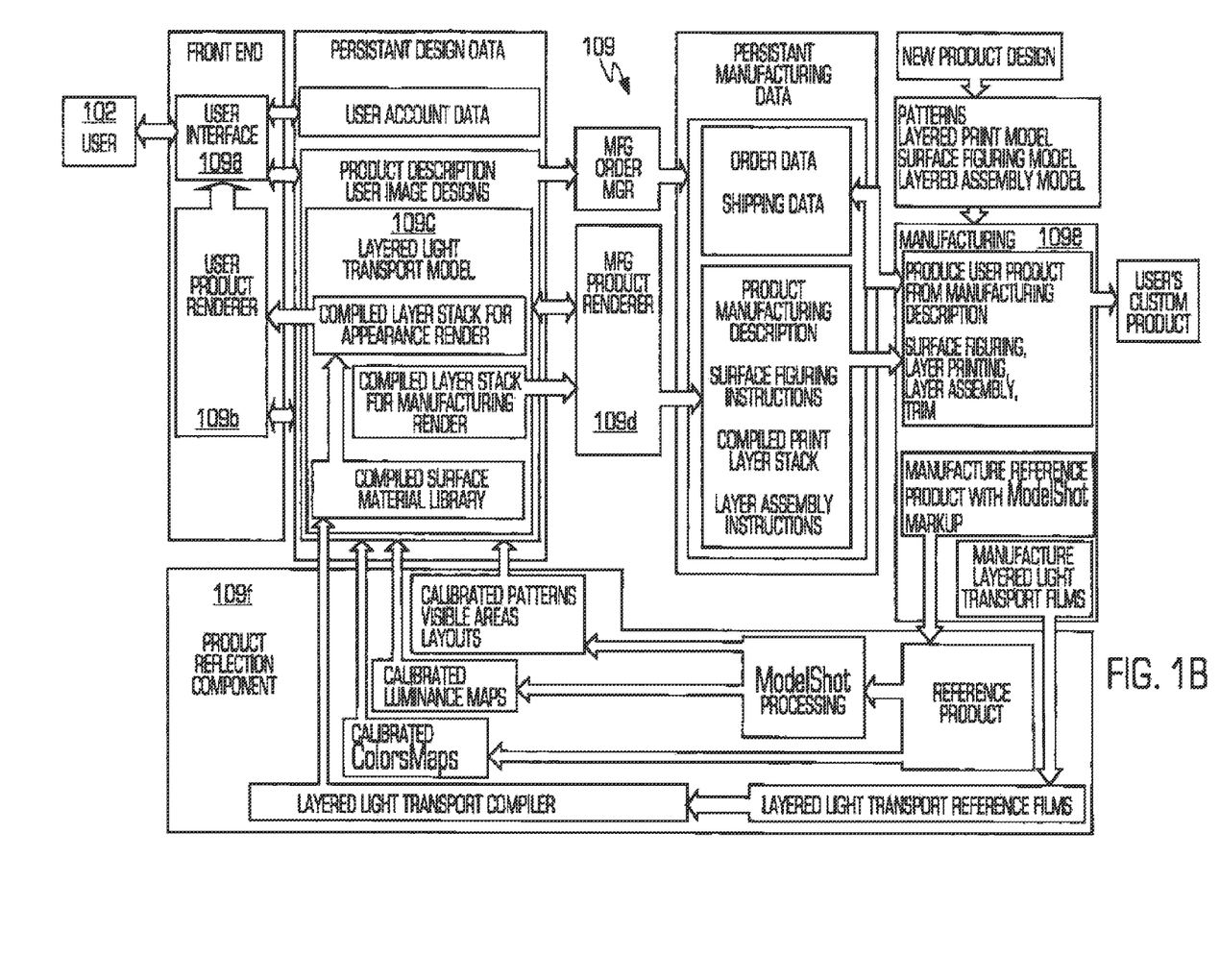
FIG. 1B illustrates more details of the product customization unit that is part of the product customization system.

FIG. 1B illustrates more details of the product customization unit 109 that is part of the product customization system. In particular, the product customization unit may further comprise a user interface portion 109*a*, a user product renderer portion 109*b*, a layered light transport model 109*c*, a manufacturing product renderer portion 109*d*, a manufacturing portion 109*e* and a reflection portion 109*f*. In one implementation, each of these portions may be implemented using a combination of hardware and software. Each of these portions of the product customization unit 109 are described in further detail with reference to FIG. 1C.

Figure 1C:
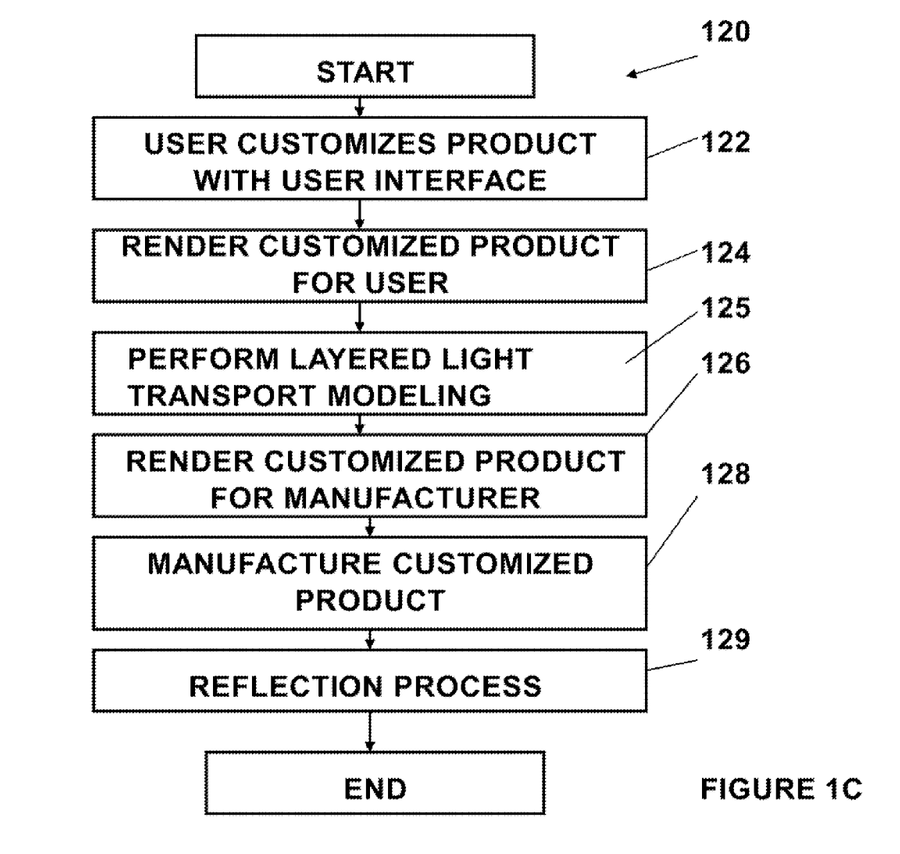
FIG. 1C illustrates an implementation of a method for product customization.

FIG. 1C illustrates an implementation of a method 120 for product customization that may be implemented, for example, by the product customization system shown in FIG. 1A. The method allows the manufacture of user designed products and the method applies user created colors and designs to a product made out of layers of material with specific optical qualities in one embodiment.

User Interface Portion

The product customization system permits a user/consumer to customize a product using the user interface portion 109a (122) that may be implemented as one more web pages in one embodiment. The user interface portion 109a allows the user to interactively apply a design to a product, such as a skateboard as described below in more detail. The data generated by the user interface portion may include user account data, a product description (that describes the user's custom product), user image designs (that contains the user content), color choice (the color(s) chosen by the user), material choice (the type of material for the custom product) and the finishing choice (the finishing selected by the user for the custom product). The user interface portion allows the user or designer to perform the following processes using the user interface:

1. Select a Skateboard style and size. (See FIGS. 2A and 2B which are described below)
2. Select or upload a design containing these items:
  a. Text.
  b. Images
  c. Vector Designs
3. Choose a product Design Area
  a. Apply design items, and position on 2d surface of design area.
  b. The UI will request and show a rendering of the product with the applied design.
4. Choose a product Design View
  a. Apply design items projected from view on 3d surface of product from View direction.
  b. The UI will request and show a rendering of the product with the applied design.
5. Choose a surface quality (material)
  a. Choose a design item, apply a surface quality from a list.
  b. The UI will request and show a rendering of the product with the new surface quality.
6. Change and Update the Design (repeat processes 2 through 5 above).
7. Choose to purchase design on product.
  a. UI processes payment choice.

The user interface portion may also assemble a set of instruction that describe the user design and requests images of the final product from the user product renderer portion 109b. The product customization system then renders the customized product for the user/consumer (124) using the user product renderer portion 109b. The user product renderer portion takes the data/information/description (based on the user interactions with the user interface portion) and other user preferences and using information supplied by the reflection portion 109f, synthesizes an image of the manufactured product that is then displayed to the user/consumer.

User Renderer Portion

In more detail, the user product renderer portion may perform the following processes:

1. Accepts a UI request for a rendering of a custom product.
  a. The Request contains:
    i. Product Style
    ii. Product Size
    iii. User designs
      1. Images
      2. Vector Graphics
      3. Text
    iv. User design properties
      1. Placement Coordinates in Design Area space.
        a. Position
        b. Rotation
        c. Scale
      2. Surface Qualities
        a. Surface selection for each Design Area
        b. Color
        c. Shininess
    v. The User Viewing Geometry
    vi. The User Lighting Geometry
2. Assembles a request for the Layered Light Transport Model for a compiled light transport model for this product, with the supplied view and lighting.
3. Renders the compiled light transport model onto the Product geometry.
4. Returns the rendered product to the User Interface component.

The reflection portion 109f (which provides feedback throughout the product customization unit) generates calibrated color maps and calibrated luminance maps to the calibrated product render assets (including geometry, luminance maps, color maps and safe area coverage maps) that are used to generate the images for the product.

Light Transport Modeling

The product customization system then performs light transport modeling process (125). The Layered Light Transport Model contains a library of optical interactions between selected layers of materials. The number of layers and therefore the number of interactions is limited by manufacturing constraints. More layers can produce a greater variety of effects, but increase the cost of manufacturing the product. For each product a subset of optical interactions may be chosen. For the purposes of a premium Skateboard product, the following layering is used (described from product bonding layer toward viewer).

1. Product Surface (wood grain)
2. Product Bonding layer (transparent)
3. Opaque Reflector: Microfine Titanium Dioxide pigment in UV activated binder.
4. Macrolayer of transmission attenuated spectral absorption material (pigment) in UV activated transparent binder.
5. UV activated transparent material (refractive index varies from layers 4).
6. Occluding macrolayer (single opaque reflective absorption, or repeat of layers 3 and 4) in UV activated transparent binder.
7. UV activated transparent material with figured surface. (refractive index varies from layers 5 and 4)

The layered light transport component uses the thin film geometry of the optical system to simplify a light transport model. It represents each pixel in a printed layer as a referenced volume cell that has 2d angular light inputs and outputs. Each reference volume contains a list of functions to process light inputs and outputs, and calibrated values for each function based on measured response from reference films. Since each volume cell has a known position, the light transport network may be implicitly linked. A request from the User Renderer is used to build the volume cell layers. Compiled stacks of volume cells may be placed at each design pixel by reference. The Layered Light Transport Model then uses the supplied light and view vectors to traverse the transport model and compile a textureInput-lightOutput map for the view and lighting of a specific product with user configured surfaces.

In this case, layered light transport reference films would be manufactured for these optical interactions:

1. Layer 7 interaction with layers 3 and 4.
   a. Refracted light input into layer 3 based on 2d surface modulation of layer 7.
   b. Refracted light output from layer 3 and 4 based on surface modulation of layer 7.
2. Layer 7, Refractive properties based on grating surface modulation.
3. Layer 6 interaction with layers 3 and 4 with modulation of Layer 5.
   a. Occluded light input into layer 3 with modulation of Layer 5.
   b. Occluded light output from layer 4 based on modulation of Layers 4 and 5.
4. Layers 7, 5 and 4 interaction.
   a. Reflection from Constructive Interference based on attenuation of Layer 5.
5. Layer 6 and 4 interaction.
   a. Diffusion of light with modulation of absorption of 4 and opacity of 6.
6. Layer 3 and 4 interaction.
   a. Response curves for pigment layers 4 and reflectance of layer 3.

These 6 reference films are manufactured with the needed modulation and are then measured over angular input and output ranges for the volume cell, and each is characterized as a function with associated response values.

Manufacturing Product Renderer Portion

The product customization system then renders the customized product for the manufacturer (126) using the manufacturing product renderer portion 109d. The Manufacturing Renderer takes the User product request, and renders the layers and printing instructions needed to print layers on the bonding or receiving film. For each design layer, it positions the user designs using the supplied coordinate systems, tags each pixel with color and surface information, and renders each layer by looking up the layer stack for each surface index. The design is reverse-warped based on data from the reflection interface, so that it will be aligned properly after heat transfer to the complex curved surface.

Manufacturing Portion

The product customization system then manufactures the customized product (128) using the manufacturing portion 109d. The manufacturing portion performs, for example, the following processes: 1) manufactures the customized design product; 2) ships the product based on the Operator directions; and/or 3) gathers product information for the Reflection portion (including patterns, reference product with calibration mark-up and/or color and material samples) that are input to a modelshot processing component that performs various modelshot processing tasks as described in more detail in U.S. patent application Ser. No. 11/925,716 filed on Oct. 26, 2007 entitled "Product Modeling System and Method" which is incorporated herein by reference. The manufacturing process is described in more detail below with reference to FIG. 5. Furthermore, the mark-up on the reference product may describe a surface curvature of the product and a boundary of the design areas (the extent of the design areas) for the design on the product. To recognize/identify the mark-up on the reference product, the product renderer portion may include a known visible imager and a known broad spectrum infrared imaging system which are well known and are used to recognize/identify the mark-up. The manufacturing portion may use a type of well known ink that is used to print the mark-up on the reference product and the ink is detectable by the visible imager of the product renderer portion, but is not detectable by the broad spectrum infrared imaging system. The product renderer portion may use the broad spectrum infrared imaging system to generate an image of a reflected luminance of the reference product with the mark-up features removed from the reference product.

The product customization system then performs the reflection process (129) using the reflection portion 109f which is a portion of the system that provides feedback to the other portions of the systems. For example, the reflection portion may performs the following tasks: 1) provides updated product information to the manufacturing product renderer portion; 2) manufactures reference product used by the user product renderer portion; 3) calibrates pattern position with the manufactures reference product; 4) provides calibrated photographic references of reference product to the user product renderer portion; 5) provides calibrated reflectance and color mapping for the user product renderer portion; and/or provides calibration feedback to the Layered Light Transport Model. Now, the user interface portion of the product customization unit will be described in more detail.

Figure 2A:
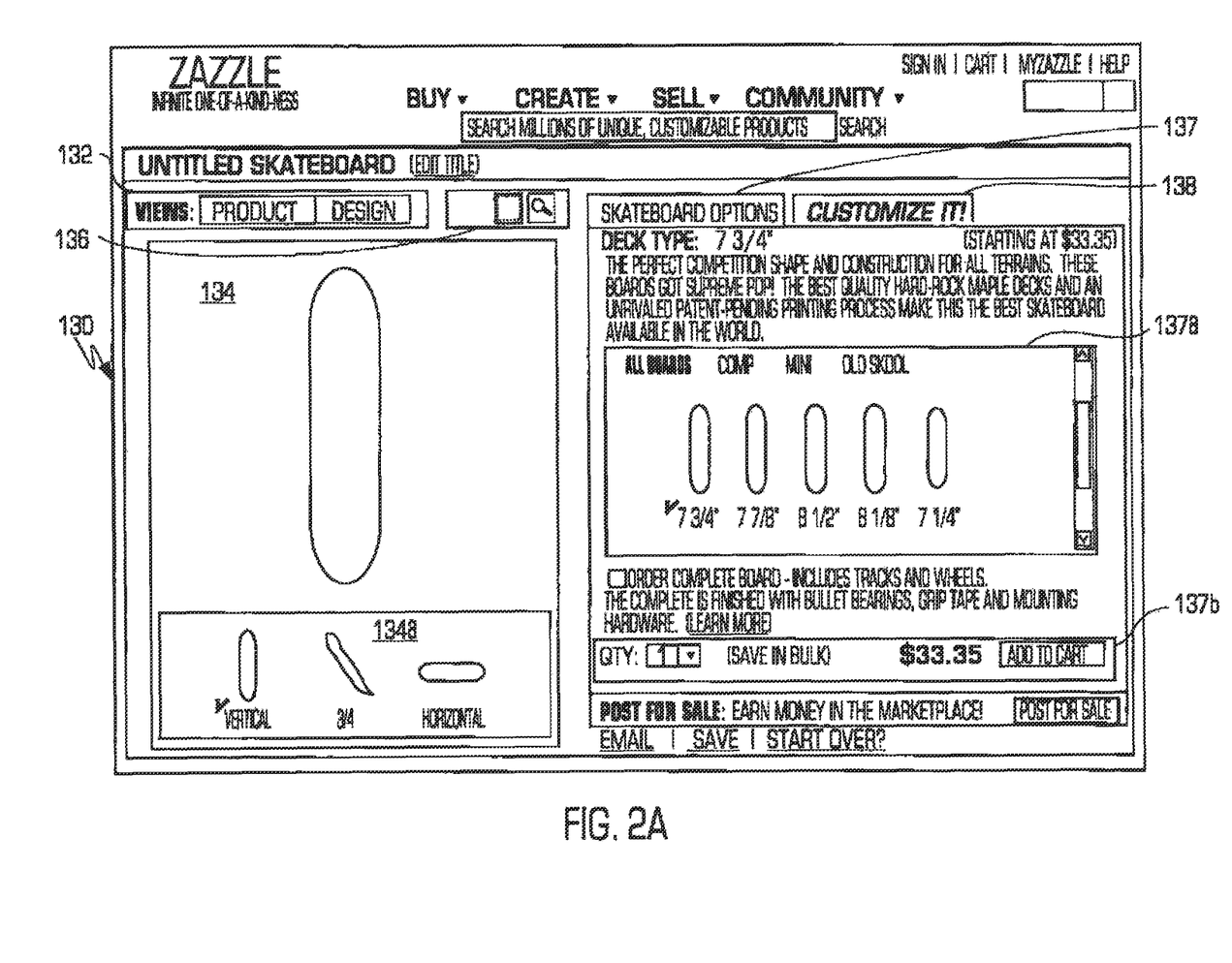
FIGS. 2A and 2B illustrate an example of a product view user interface of the product customization system.
Figure 2B:
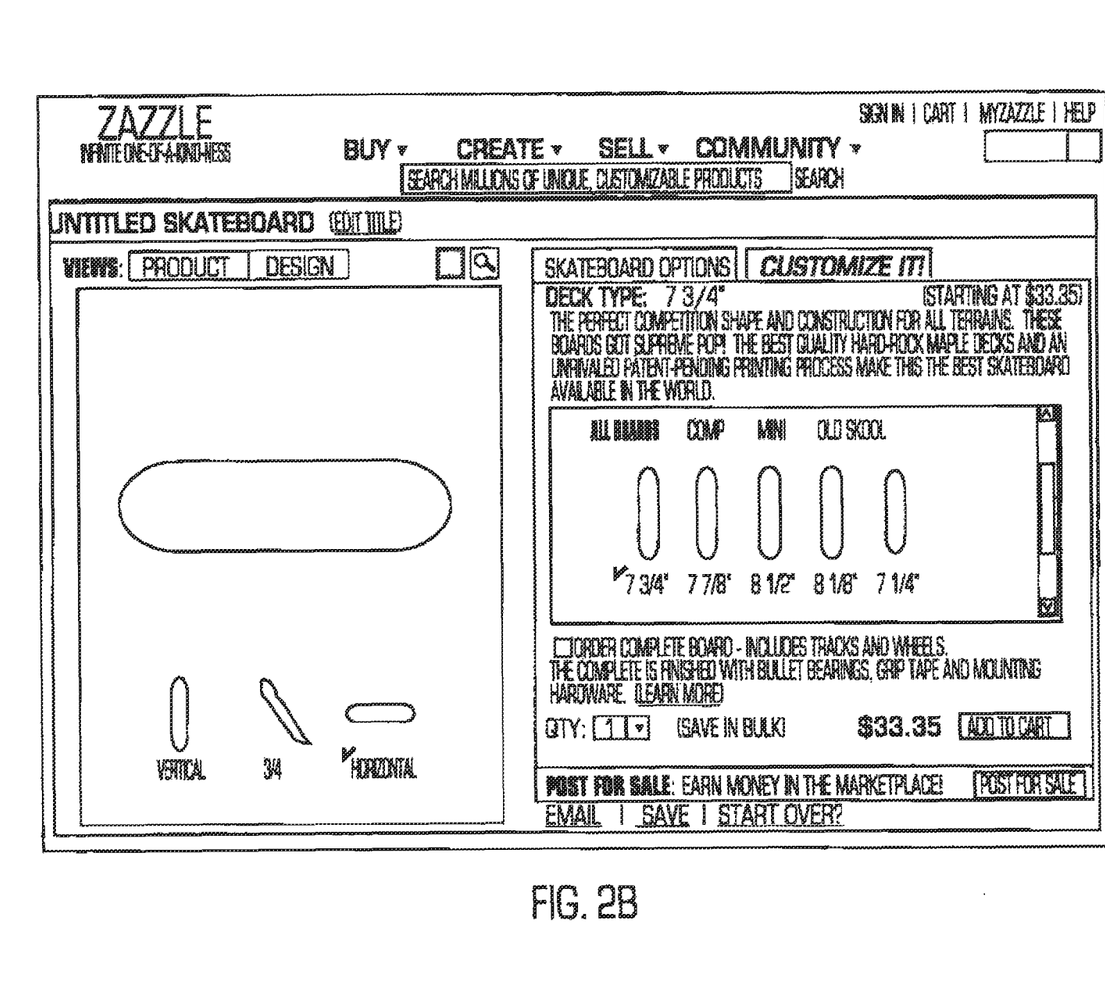
Figure 3:
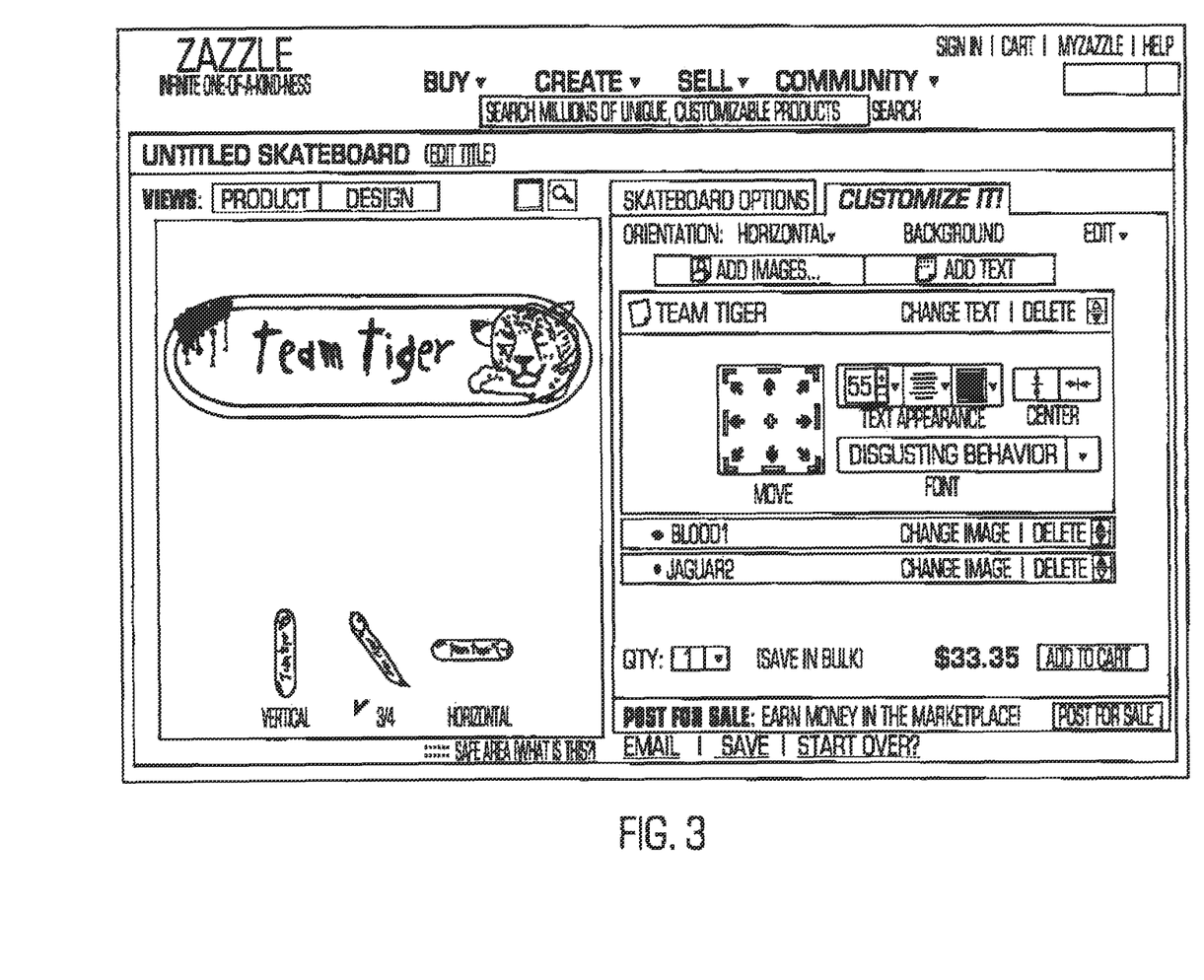
FIG. 3 illustrates an example of a product design user interface of the product customization system.

FIGS. 2A and 2B illustrate an example of a user interface 130 of the product customization system. The user interface may include a view option portion 132 that allows the user/consumer to select between a product view as shown in FIG. 2A or 2B (the product image with or without the user content shown) or a design view as shown in FIG. 3 (the pieces of product on which the user/consumer can place the user content) in a view portion 134. The view portion also has a view selector 134a that allows the user/consumer to select among the views (upper, outside quarter, outside front or tongue for example) to be displayed in the view portion. The user interface also allows the user to view the transparency and/or opacity of the design. The user interface may also include a view tools portion 136 that allows the user to cut a portion of the view (dotted box tool), zoom the view (the magnifying glass tool) and/or view the pair of products together in the view portion. In the user interface, as product moves/is moved by the user or the lighting changes or is changed by the user, the product image shown to the user changes accordingly.

The user interface further comprises a product options tab 137 (a skateboard option tab because the product in the example is a skateboard) that allows the user to select various product options and a customize it tab 138 that allows the user to customize the product with user content as described below in more detail. As shown, the product options tab (for the example in which the product is a skateboard) may further include a product summary portion 137a that displays a summary of the particular product and a commerce portion 137b that allows the user to select a quantity of products to purchase, shows the accumulated price of the products and allows the user to add the customized products to an electronic shopping cart.

Figure 4A:
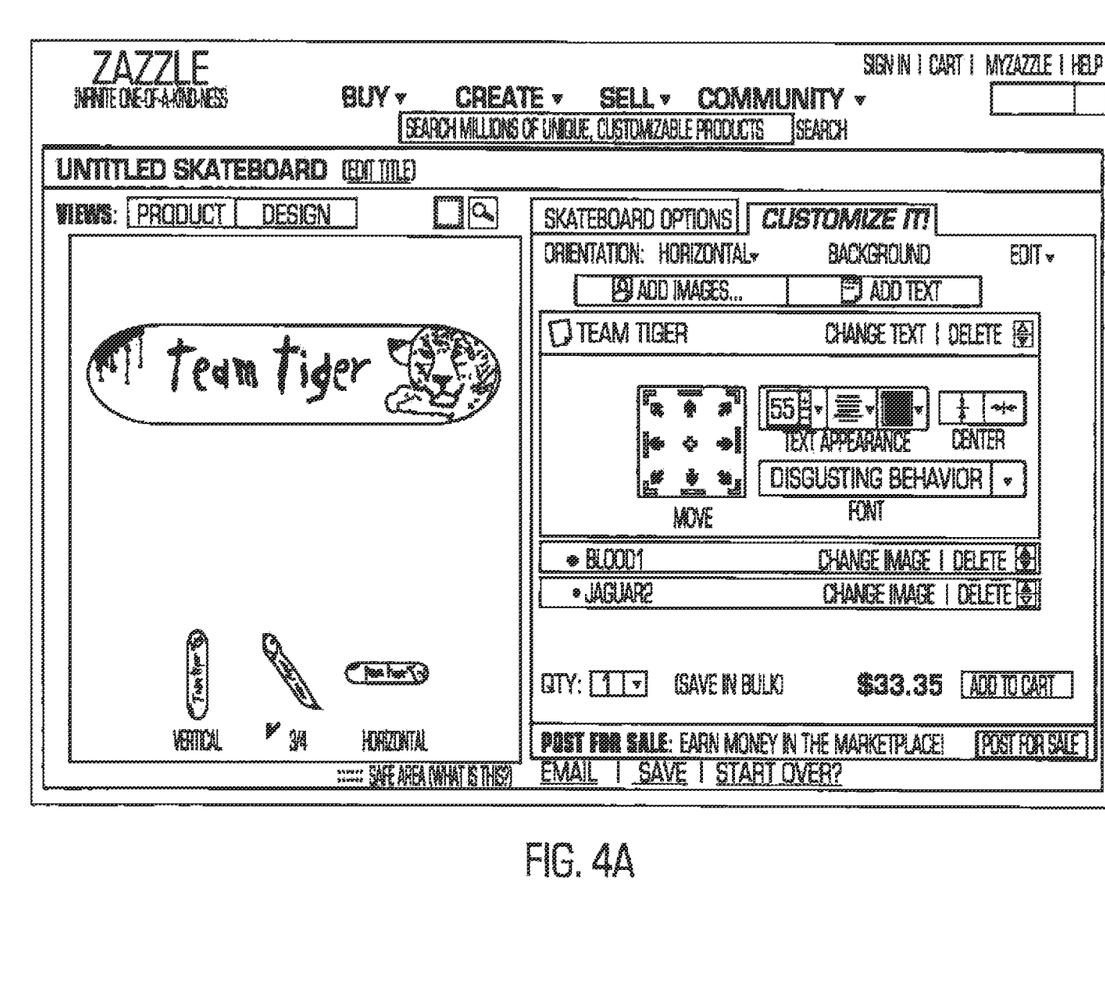
FIGS. 4A and 4B illustrate an example of a product view user interface of the product customization system when a product has a customized user design.
Figure 4B:
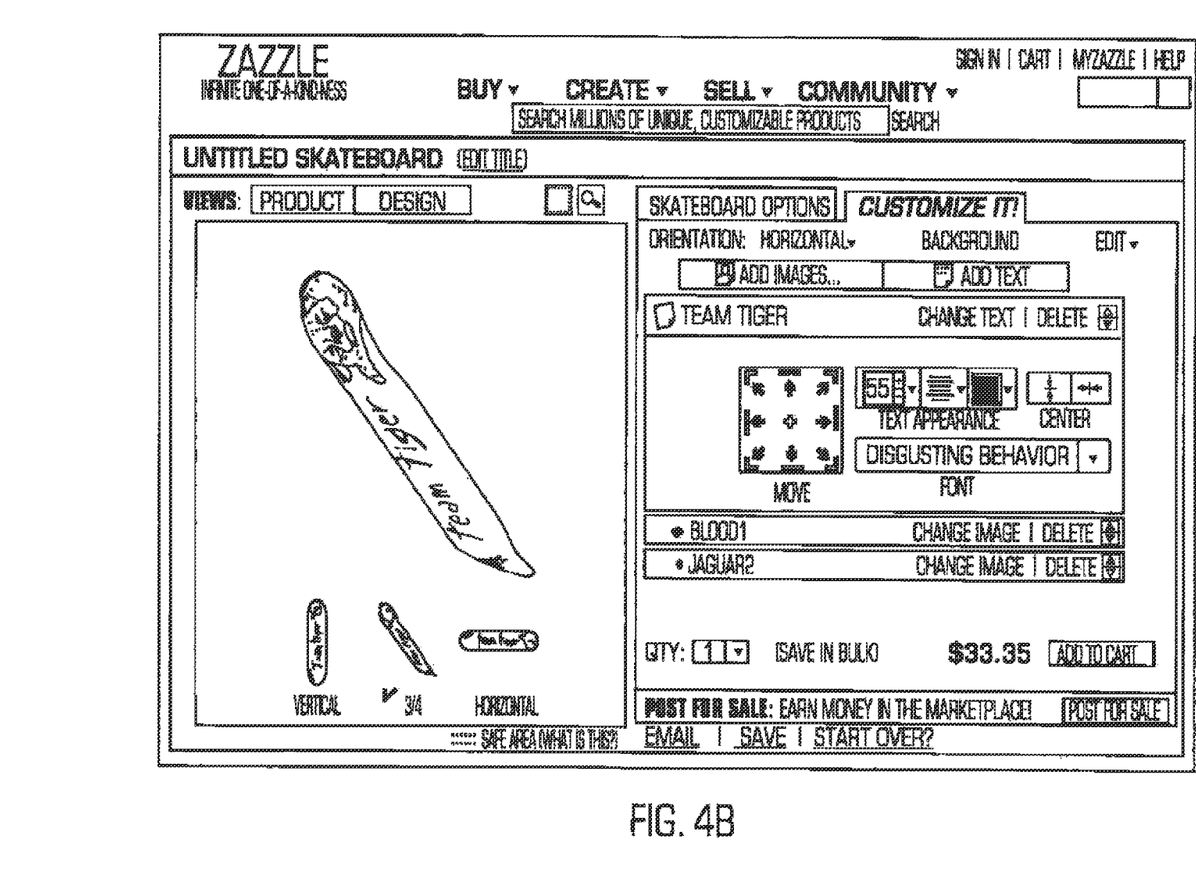

FIG. 3 illustrates an example of a product design user interface of the product customization system. The user interface allows the user/consumer to add images using an add images portion and/or add text using an add text portion. FIGS. 4A and 4B illustrate an example of a product view user interface of the product customization system when a product has a customized user design. Now, the manufacturing process is described in more detail.

Figure 5:
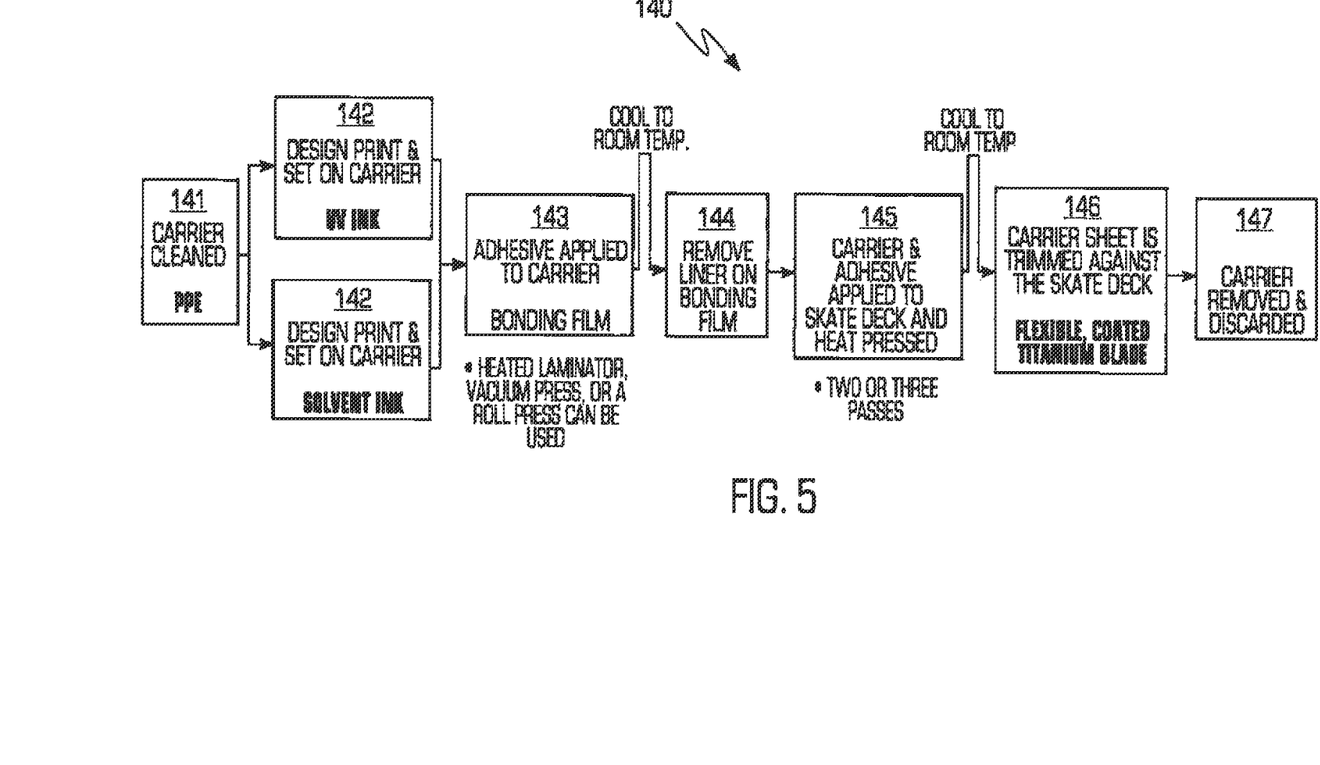
FIG. 5 illustrates more details of the manufacturing process.

FIG. 5 illustrates more details of the manufacturing process 140. In one illustrative example, the following materials and equipment may be used (although the system and method are not limited to these materials and equipment):

1) Material
Blank skateboard
Print Carrier: proprietary low friction plastic film
Bonding Film: proprietary, heat-activated thermoplastic film
UV inks
C,M,Y,K+White+Clear Ink
2) Equipment
UV Curable, white ink enabled printer (flatbed or roll-to-roll)
Large Format Hot-Laminator
Large Format Vacuum Press
Proprietary heat press for applying bonding film to a curved surface
Proprietary trimming knife As shown in FIG. 5, the manufacturing process may include cleaning a carrier sheet (141). In one example, the carrier sheet may be a proprietary low friction plastic film. Once the carrier is cleaned and placed onto a flat surface, the user design is rasterized and sent to the output printer in (2) passes (142). During the first pass, a color layer (printed with CMYK+Clear separations) is laid down, followed by a layer of white ink in the second pass. When UV curable ink is used, the ink is set immediately by an in-line UV lamp attached to the head carriage. When solvent ink is used, the ink is set with the appropriate setting agent. In other embodiments, more than two layers may be laid down on the carrier sheet which creates a layering effect of the design. Furthermore, a white layer may be unnecessary depending on the desirable opacity of the design. In other embodiments, solid inks or soy inks may be used.

Once the design is laid down and set on the carrier sheet, an adhesive is applied to the carrier sheet and bonded (143) using a heater laminator, vacuum press or roll press. In one embodiment, a bonding film is applied on top of the UV ink on the carrier sheet. Then, the carrier sheet and bonding film are sent through a bonding station. Then, the liner on the bonding film is removed (144). Then, the liner sheet is registered and positioned on a blank skateboard deck with registration facilitated by using a light table as the carrier sheet is translucent. Once the liner sheet is positioned, the carrier sheet with the adhesive is applied to the skateboard blank (145). In one implementation, the carrier sheet is pressed to the skateboard deck using a proprietary heat press. Then, the skateboard deck is allowed to cool down to room temperature. Then the carrier sheet is trimmed against the skateboard deck using the proprietary trimming knife (146). Then the liner is removed (147) and the customized skateboard deck is complete.

In addition to the manufacturing processes described above, the manufacturing process may also include generating a symbol, tracking number, tracking indicia and/or product identifier (collectively, an "identifier") on an outer portion of the transfer that allows each design or run of designs to be tracked using well known scanning and machine vision techniques. The tracking of the products/designs may be performed by a tracking portion of the system that may be implemented in a plurality of lines of computer code as well as the scanner/machine vision hardware. Alternatively, the modelshot processing described above may be used to recognize a particular product or product run during the manufacturing process.

The identifier also may be applied to the product so that it is non-visible. The techniques for obfuscating the identifier (making it non-visible to a human being) may include: 1) applying the identifier with an ink or dye that has an absorption curve outside of the visible spectrum; 2) encoding the identifier in the halftone or dot pattern of the printed image; 3) applying the identifier as a change in surface reflectance; 4) applying the identifier as a change in refractive index (phase change); 5) applying the identifier as a quarter wave film that induces a change in polarization of light; 6) applying the identifier as a change in surface magnetic flux; and/or 7) applying the identifier as a film that causes a change in surface electrical capacitance.

Figure 6:
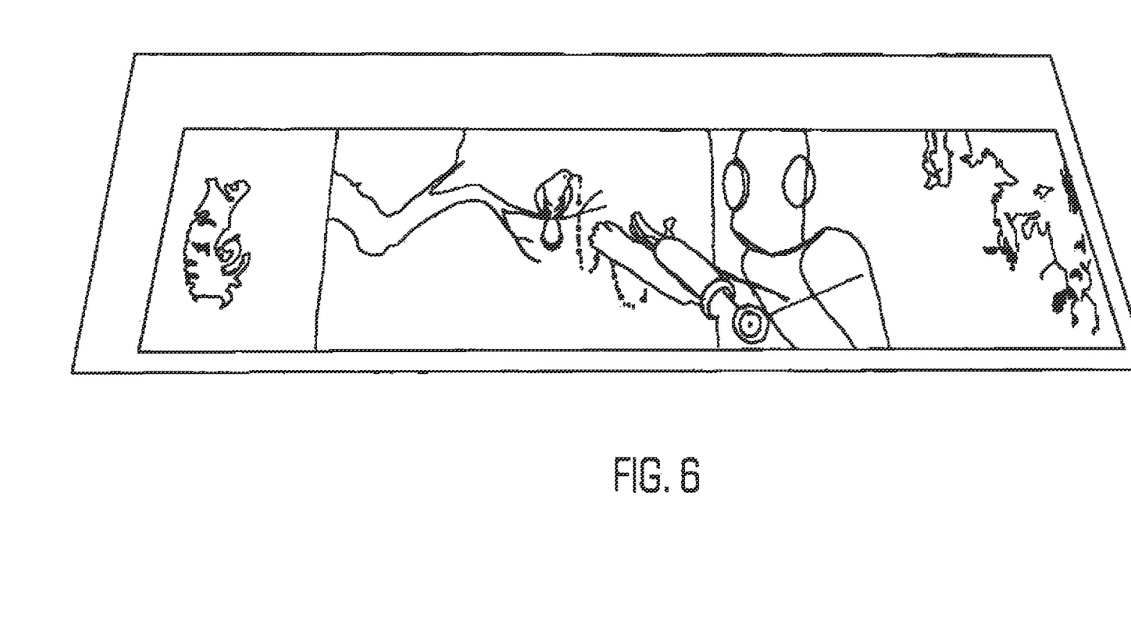
FIG. 6 illustrates an example of a carrier with a design.
Figure 7:
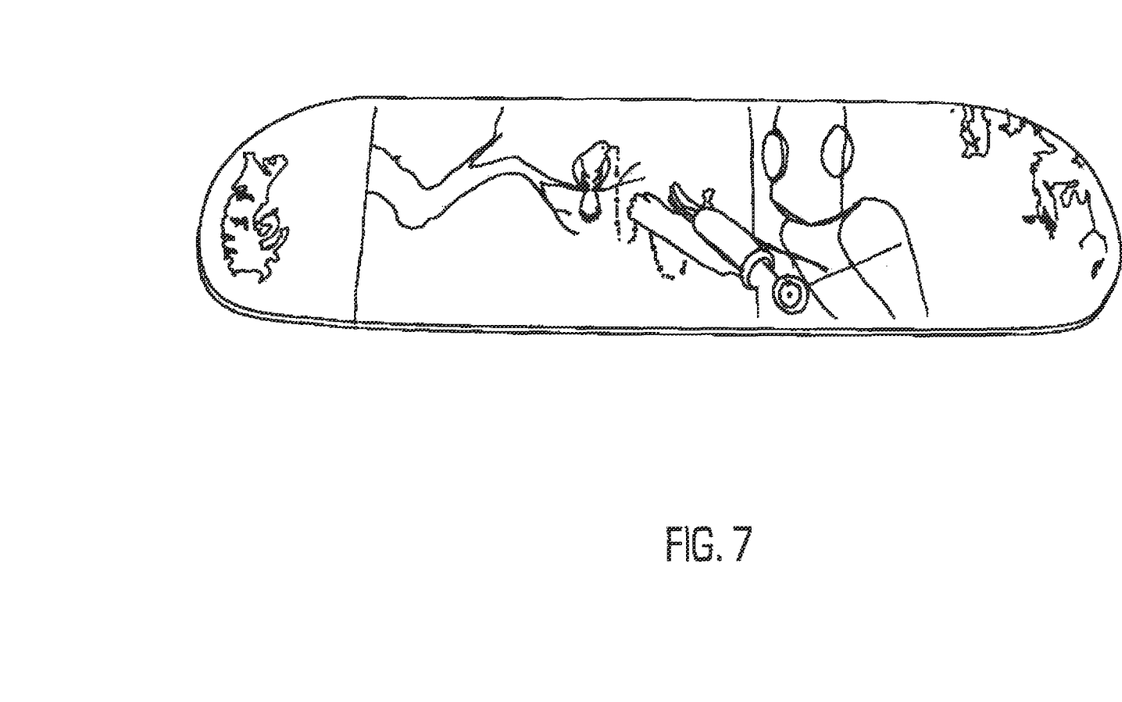
FIG. 7 illustrates a manufactured skateboard with the user design.

FIG. 6 illustrates an example of a carrier with a design and FIG. 7 illustrates a manufactured skateboard with the user design from FIG. 6 bonded to the skateboard.

In addition to the product manufacturing described above, the system and method may also be used to generate a tool that can then be used for mass production of a product with the surface. For example, the tool may be built by using printed layers to form a mask or transfer element for mass produced products. In addition, the tool may be applied to produce multiples with similar optical qualities. The method for production of the tool and subsequent product replication may include: 1) using the methods and system described above that can produce a single layer of a single product to produce a relief (tool which encodes image information as thickness) that is then used to stamp, transfer, or emboss similar or related multiples of the product; 2) using the methods and system described above that can produce a single layer of a single product to produce a mask (tool which encodes image information as a void in a matrix) that is then used for the application of a variety of materials to produce multiples of the product with specific physical or optical characteristics; 3) using the methods and system described above that can produce a single layer of a single product to produce an optical print (tool which encodes the image information as transparency or opacity) that then is used to produce multiples of the product using photographic processes; 4) using the methods and system described above that can produce a single layer of a single product to produce a change in the affinity of a surface for a chemical compound (tool which encodes the image information as water-loving or water resisting for instance) that then is used to produce multiples of the product using this surface affinity; and/or 5) using the methods and system described above that can produce a single layer of a single product to produce a surface change in electrical charge (tool which encode the image information as a change in electrical potential) that is then used to attract and transfer material for transfer. This also may produce similar or related multiples of the original product.

While the foregoing has been with reference to a particular embodiment of the invention, it will be appreciated by those skilled in the art that changes in this embodiment may be made without departing from the principles and spirit of the invention, the scope of which is defined by the appended claims.

The invention claimed is:

1. A computer implemented system for designing and producing a customized product having at least one bonding film and at least one receiving film, the system comprising:

a user interface portion that generates a user interface so that a design with user content is capable of being applied to an uneven surface of a product, the user interface portion also generating a product description including the user content, a color of the product, a material of the product and a finishing of the product;

a product renderer portion that generates a visual three dimensional representation of a finished product with the user content based on the product description wherein the visual three dimensional representation of a finished product with the user content is displayed using the user interface portion;

a light transport model portion that generates, for a particular uneven surface of the product having a lighting and a view vector, a texture input—light output map for the particular uneven surface of the product;

a manufacturing product rendering portion that, based on the product description and the texture input—light output map, renders one or more layers of printing for one or more of a bonding layer and a receiving layer and renders one or more printing instructions to print the one or more of the bonding layer and the receiving layer on a film; and a manufacturing portion that prints the user content onto one or more of the bonding layer and the receiving layer to form one or more bonding layer films and one or more receiving layer films and that applies the design with user content onto the uneven surface of the product using the films to produce a customized product.

2. The system of claim 1, wherein the manufacturing portion produces a reference product with mark-up to describe a surface curvature and an extent of design areas of the product for the product renderer portion.

3. The system of claim 2, wherein the product renderer portion uses visible imaging and broad spectrum infrared imaging to recognize the markup on the reference product.

4. The system of claim 3, wherein the manufacturing portion uses an ink to print the mark-up transferred to the reference product are detectable by the visible imaging, but are not detectable in the broad spectrum infrared imaging.

5. The system of claim 2, wherein the product renderer portion uses the infrared imaging to produce an image of a reflected luminance with mark-up features removed from the reference product.

6. The system of claim 1, wherein the user content comprises one or more of a piece of text, an image, a photograph, a user designed image and a vectored design.

7. A method for designing and producing a customized product, the method comprising:

providing a computer based customized product unit;

generating, using a user interface portion of the computer based customized product unit, a user interface so that a design with user content is capable of being applied to an uneven surface of a product, the user interface portion also generating a product description that contains the user content, a color of the product, a material of the product and a finishing of the product;

generating, using a product renderer portion of the computer based customized product unit, a visual three dimensional representation of a finished product with the user content based on the product description wherein the visual three dimensional representation of a finished product with the user content is displayed using the user interface portion;

generating, using a light transport model portion of the computer based customized product unit, a texture input—light output map for the particular uneven surface of the product having a lighting and a view vector;

rendering, using a manufacturing product rendering portion of the computer based customized product unit, one or more layers of printing for one or more of a bonding layer and a receiving layer based on the product description and the texture input—light output map and rendering one or more printing instructions to print the one or more of the bonding layer and the receiving layer on a film based on the product description and the texture input—light output map;

printing, using a manufacturing portion of the computer based customized product unit, the user content onto one or more of the bonding layer and the receiving layer to form one or more bonding layer films and one or more receiving layer films; and applying, using a manufacturing portion of the computer based customized product unit, the design with user content onto the uneven surface of the product using the films to produce a customized product.

8. The method of claim 7, wherein the user content comprises one or more of a piece of text, an image, a photograph, a user designed image and a vectored design.

9. The method of claim 7 further comprising producing, using the manufacturing portion, a reference product with a mark-up to describe a surface curvature and an extent of the design areas of the product for the product renderer portion.

10. The method of claim 9 further comprising using, by the product renderer portion, both visible imaging and a broad spectrum infrared imaging to recognize the markup on the reference product.

11. The method of claim 10 further comprising using, by the manufacturing portion, an ink for the mark-up on the reference product is detectable by the visible imaging and not detectable by broad spectrum infrared imaging.

12. The method of claim 11 further comprising producing, using infrared imaging by the manufacturing portion, an image of a reflected luminance with mark-up features removed from the reference product.

* * * * *